(12) United States Patent
LaPree et al.

(10) Patent No.: US 9,784,028 B1
(45) Date of Patent: Oct. 10, 2017

(54) EFFICIENT DOOR ASSEMBLY

(71) Applicant: International Business Machines Corporation, Armonk, NY (US)

(72) Inventors: Scott R. LaPree, Rochester, MN (US); Stephen P. Mroz, Rochester, MN (US); Michael D. O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/161,318

(22) Filed: May 23, 2016

(51) Int. Cl.
*F24F 13/08* (2006.01)
*E06B 7/08* (2006.01)
*E06B 5/00* (2006.01)
*H05K 7/14* (2006.01)
*H05K 7/20* (2006.01)

(52) U.S. Cl.
CPC ............... *E06B 7/08* (2013.01); *E06B 5/006* (2013.01); *H05K 7/1488* (2013.01); *H05K 7/20* (2013.01)

(58) Field of Classification Search
CPC ........ F24F 13/082; F24F 13/08; F24F 13/075; F24F 13/06; E04C 2/423; H05K 5/00; H05K 7/16
USPC .......................... 181/224, 225; 361/724–727
See application file for complete search history.

(56) References Cited

U.S. PATENT DOCUMENTS

| | | | |
|---|---|---|---|
| 3,971,326 A * | 7/1976 | Svirklys | B65D 19/0095 108/56.1 |
| 4,866,900 A * | 9/1989 | Dunn | E04B 9/067 403/363 |
| 5,024,550 A * | 6/1991 | Mainville | E03F 5/06 210/163 |
| 5,060,752 A | 10/1991 | Heiberger | |
| 5,473,125 A | 12/1995 | Stief et al. | |
| 7,334,662 B1 | 2/2008 | Anderl et al. | |
| 7,646,603 B2 | 1/2010 | Bard et al. | |
| 7,986,526 B1 | 7/2011 | Howard et al. | |
| 8,485,310 B2 | 7/2013 | Tanabe et al. | |

(Continued)

FOREIGN PATENT DOCUMENTS

DE        102008011010 A1    8/2009

OTHER PUBLICATIONS

Lapree et al., "Efficient Door Assembly," U.S. Appl. No. 15/390,160, filed Dec. 23, 2016.

(Continued)

*Primary Examiner* — Rodney Mintz
*Assistant Examiner* — Daniel Kenny
(74) *Attorney, Agent, or Firm* — Peter J. Edwards

(57) ABSTRACT

A door assembly comprises a rectangular door frame that has a first, second, third, and fourth frame member. The first frame member has an outer surface that has a first pair of parallel slots. A first parallel flange protrudes from and perpendicular to the outer surface between the parallel slots. A vane extends from the first frame member to the second frame member between the third and fourth frame members. The vane has a first end that includes a pair of parallel flanges fitted into the parallel slots such that a rear surface of the first planar flange is arranged between rear edges of the first parallel flanges. A bar is mounted to the rear surface of the first planar flange and configured to hold the rear edges of the first parallel flanges in substantially the same plane as the rear surface of the first planar flange.

18 Claims, 7 Drawing Sheets

(56) References Cited

U.S. PATENT DOCUMENTS

| | | |
|---|---|---|
| 8,911,033 B2 | 12/2014 | Li et al. |
| 9,232,669 B2 | 1/2016 | Love, II et al. |
| 2008/0245607 A1 | 10/2008 | Gilliland et al. |
| 2009/0201640 A1 | 8/2009 | Bard et al. |
| 2013/0160479 A1 | 6/2013 | Webster et al. |
| 2016/0326735 A1* | 11/2016 | Krcil .................. E03F 5/06 |

OTHER PUBLICATIONS

IBM, List of IBM Patents or Patent Applications Treated as Related, Jan. 16, 2017, 2 pages.

Lapree et al., "Acoustic Door", U.S. Appl. No. 29/559,054, filed Mar. 24, 2016.

Lapree et al., "Method and Apparatus for Acoustical Noise Reduction and Distributed Airflow", U.S. Appl. No. 14/966,579, filed Dec. 11, 2015.

\* cited by examiner

EFFICIENT DOOR ASSEMBLY

BACKGROUND

Aspects of the present disclosure relate to server mounting infrastructure, more particular aspects relate to server door construction.

Typical server doors are designed to allow air to flow through the server door, while preventing noise and electromagnetic radiation from spreading from one side of the door to the other. These conflicting design objectives lead to server doors of varying complexity, which often causes the doors to be expensive to manufacture and assemble.

SUMMARY

Some embodiments of the present disclosure can be illustrated by an assembly for a door. The assembly comprises a rectangular door frame that has a first, second, third, and fourth frame member. The first frame member comprises an outer surface that has a first pair of parallel slots. The outer surface has a first planar flange arranged between the first pair of parallel slots and protrudes out from and perpendicular to the outer surface. The assembly further comprises a vane extending from the first frame member to the second frame member and between the third and fourth frame members. The vane has a first end that includes a first pair of parallel flanges fitted into the first pair of slots, such that a rear surface of the first planar flange is arranged between rear edges of the first parallel flanges. The door assembly also comprises a bar mounted on the rear surface of the first planar flange. The bar is mounted such that it holds the rear edges of the first parallel flanges in substantially the same plane as the rear surface as the first planar flange.

Some embodiments of the present disclosure can be illustrated by a method of assembling a door. A first end of a first vane is attached to a first frame member of the door. The attaching includes inserting a first pair of parallel flanges on the first end into a first pair of parallel slots on an outer surface of the first frame member. The parallel flanges are inserted into the slots such that a rear surface of a first planar flange is arranged between rear edges of the first parallel flanges. The attaching also includes mounting a first bar to the rear surface of the first planar flange such that the bar holds the rear edges of the first parallel flanges in substantially the same plane as the rear surface of the first planar flange. A second end of the first vane is then attached to a second frame member of the door. The second frame member is opposite the first frame member with respect to the door. The attaching the second end includes inserting a second pair of parallel flanges on the second end into a second pair of parallel slots on an outer surface of the second frame member. The parallel flanges are inserted into the slots such that a rear surface of a second planar flange is arranged between rear edges of the second parallel flanges. The attaching the second end also includes mounting a second bar to the rear surface of the second planar flange such that the second bar holds the rear edges of the second parallel flanges in substantially the same plane as the rear surface of the second planar flange. Finally, the attaching the second end further comprises mounting the first sub member to a second sub member of the second frame member, the second sub member being fixedly attached to the door assembly.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
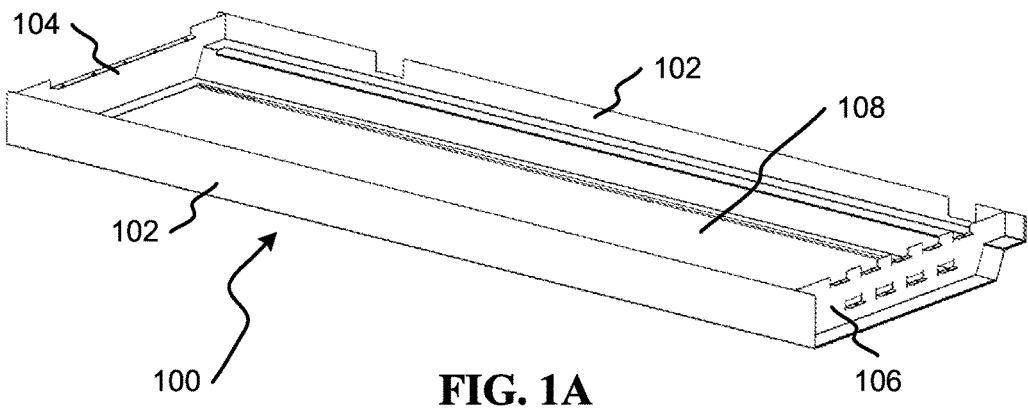
FIG. 1A depicts the frame of a server-rack door to which insulating components may be added, in accordance with embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to server mounting infrastructure, more particular aspects relate to server door construction. While the present disclosure is not necessarily limited to such applications, various aspects of the disclosure may be appreciated through a discussion of various examples using this context.

Some components in specialized computer systems, such as large servers, are typically produced in small volumes. In some cases this may be due to those components being custom designed for each use case. In some other cases this may be due to those components being used in extremely high-end products, the market for which may be small. These small volumes oftentimes do not justify the up-front expense of developing solutions to automate tooling or assembly of the related components. Server rack doors, for example, are typically built at volumes that do not justify machine welding of door components, such as the aerodynamic components used to direct airflow into or out of the server rack or insulation components used to stop electromagnetic radiation or the noise of server fans from spreading to the server room. Human labor may be utilized for these components, which may be very expensive per part. Further, the cost of human labor increases quickly as the complexity or intricacy of a component or assembly process increases. Thus, server-rack doors are often designed to keep labor costs low. These basic server-rack-door designs are often less functional than optimal designs that may cost more to produce.

Some embodiments described in the present disclosure improve upon server-rack-door technology by providing component design and a method of assembly that may be performed by human labor quickly while still producing efficient airflow and acoustic and electrical insulation. In some embodiments little to no welding of door components may be required. Some embodiments may hide the mounting points of all door components, resulting in an aesthetically appealing design. Some embodiments may utilize similar connections across multiple components, enabling the same or similar construction methods to be utilized across multiple server-rack doors designed for different use cases.

Figure 1B:
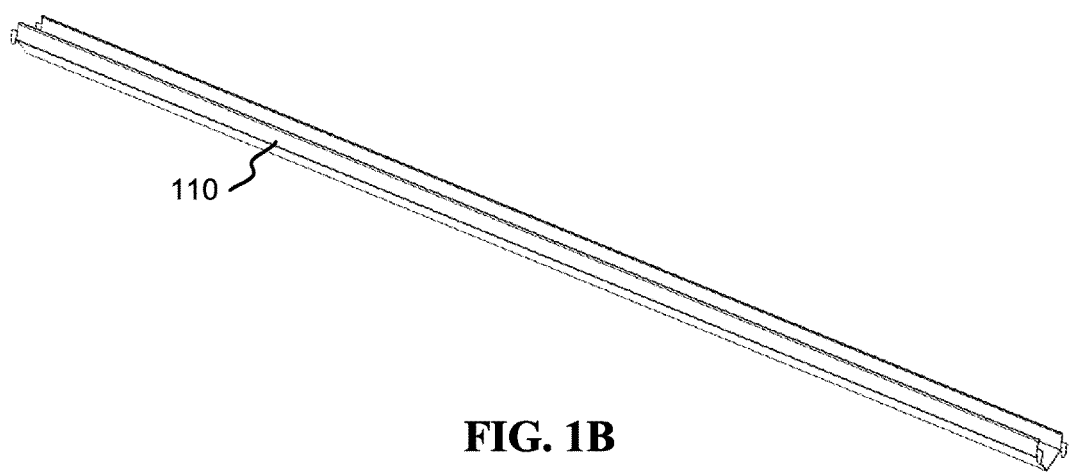
FIG. 1B depicts a vane that may be added to a server-rack door, in accordance with embodiments.
Figure 1C:
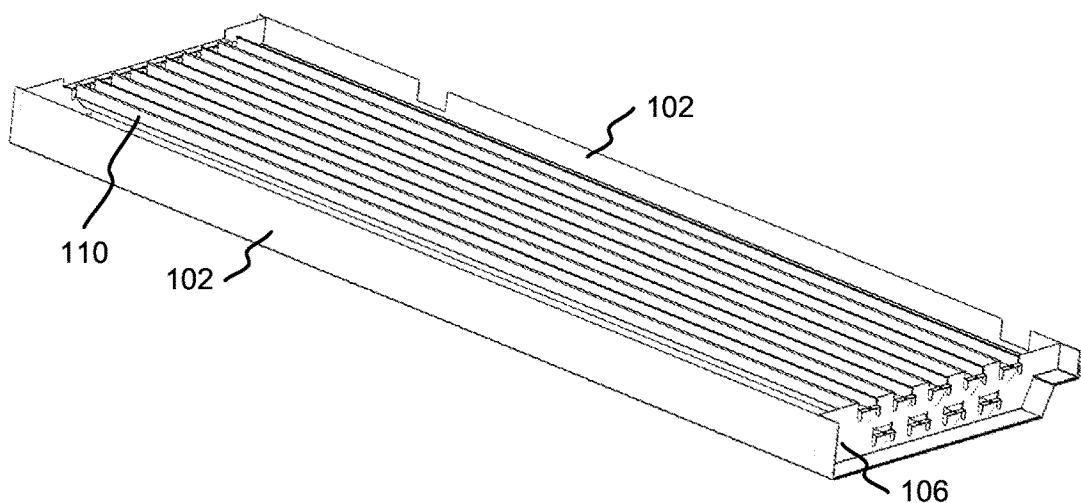
FIG. 1C depicts the frame of a server-rack door to which multiple vanes have been added, in accordance with embodiments.

FIG. 1A depicts the Frame 100 of a server-rack door to which aerodynamic and insulating components may be added (referred to herein as "vanes"). Frame 100 may have two Side Members 102, Top Member 104, and Bottom Member 106. Together these four members may define Opening 108, through which air may flow to cool components of the server. FIG. 1B depicts Vane 110, which may be added to Frame 100. In some embodiments Vane 110 may interface with any of Top Member 104, Bottom Member 106, and Side Members 102. For example, FIG. 1C illustrates multiple Vanes 110 interfacing with Bottom Member 106. In some embodiments Vanes 110 may interface with Top Member 104 or both Top Member 104 and Bottom Member 106. In other embodiments, Vanes 110 may span the opening in a perpendicular direction by interfacing with one or both of Side Members 102.

Figure 2:
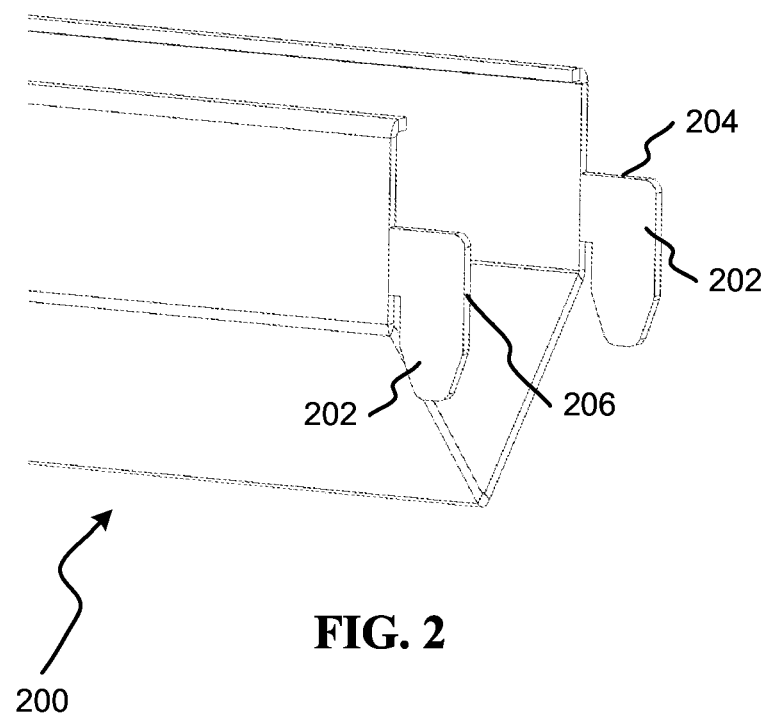
FIG. 2 depicts the end of a vane that may be securely attached to a server door, in accordance with embodiments.

FIG. 2 illustrates one embodiment of the end of a vane that may be securely attached to a server door without welding or other significant human labor. The end of Vane 200 has two parallel Flanges 202. Flanges 202 are "L shaped," which creates a gap between the vertical portion of each Flange 202 and the body of Vane 200. These Flanges 202 may be inserted into an opening on the frame of a server door and used to secure Vane 200 in place in the door. Flanges 202, in this embodiment, have Rear Edge 204 and Side Edge 206, one or both of which may be utilized in bracing Vane 200 when Flanges 202 are inserted into a server door.

In some embodiments, other flange shapes may be utilized with similar effects. In some embodiments, for example, Flanges 202 may be curved to create a hook shape, rather than bent as shown. In other embodiments Flanges 202 may not exhibit any bend or curve, but may protrude straight from Vane 200. In this embodiment two Flanges 202 are shown on either side of the end of Vane 200, which may increase stability of Vane 200 when mounted. However, in some embodiments different positions of Flanges 202 may be utilized.

Figure 3:
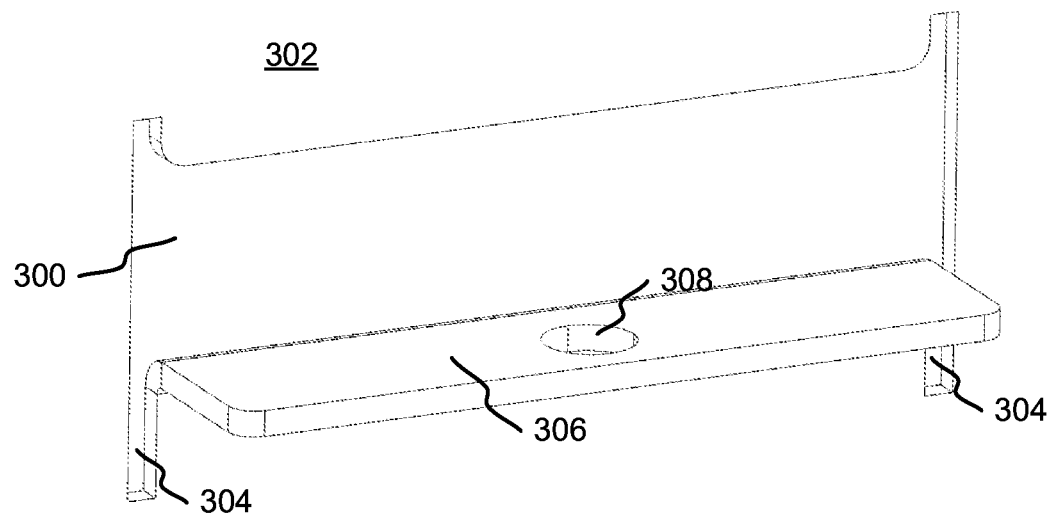
FIG. 3 depicts a frame member with which the end of a vane may interface, in accordance with embodiments.

FIG. 3 illustrates one embodiment of a frame member with which the end of a vane may interface. Opening 300 is found on Surface 302, which may be the end of a server-door frame (e.g., Bottom Member 106 of FIG. 1C). The ends of a vane may be inserted through Opening 300 and into Slots 304 to secure the vane in place. For example, Flanges 202 of FIG. 2 may be inserted into Slots 304 such that the gap between the vertical portion of the L-shaped Flange 202 and Vane 200 are positioned on opposite ends of the frame member (e.g., Bottom Member 106 of FIGS. 1A & 1C). This may prevent Vane 200 from separating from the frame member without first being lifted out of Slots 304. Note that, in this embodiment, Opening 300 is significantly greater than Slots 304. This may enable vane ends of different shapes to interface with the frame member. In other embodiments, however, Opening 300 may be of a shape and size corresponding to a specific vane end (e.g., an opening corresponding to Flanges 202 of Vane 200 may be limited to two parallel slots).

The frame member of FIG. 3 also has Planar Flange 306. In some embodiments Planar Flange 306 may be used as a structural support for additional components that may assist in securing the end of a vane to the frame member. In this embodiment such components may attach to the flange through Hole 308 (e.g., by means of a bolt), but in other embodiments other attachment mechanisms may be used.

Figure 4A:
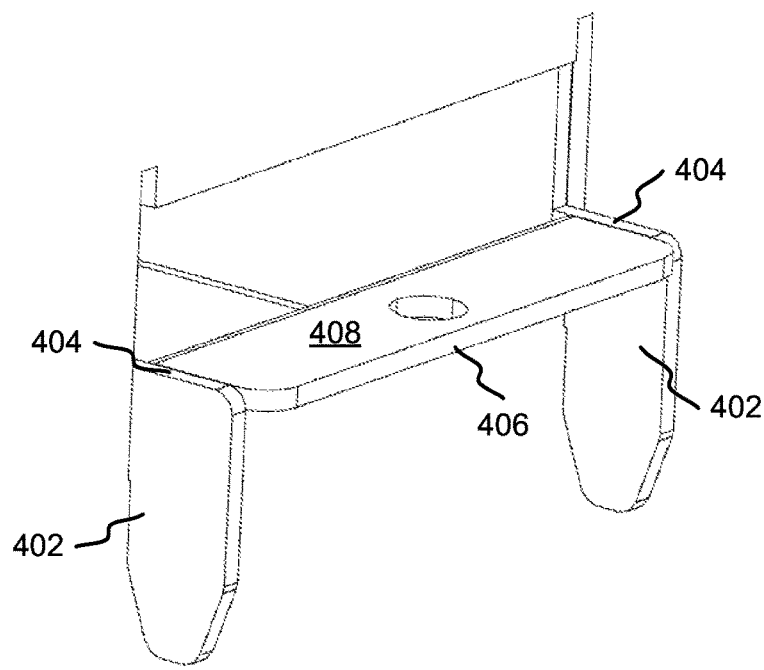
FIG. 4A depicts a frame member and end of a vane interfacing, in accordance with embodiments.
Figure 4B:
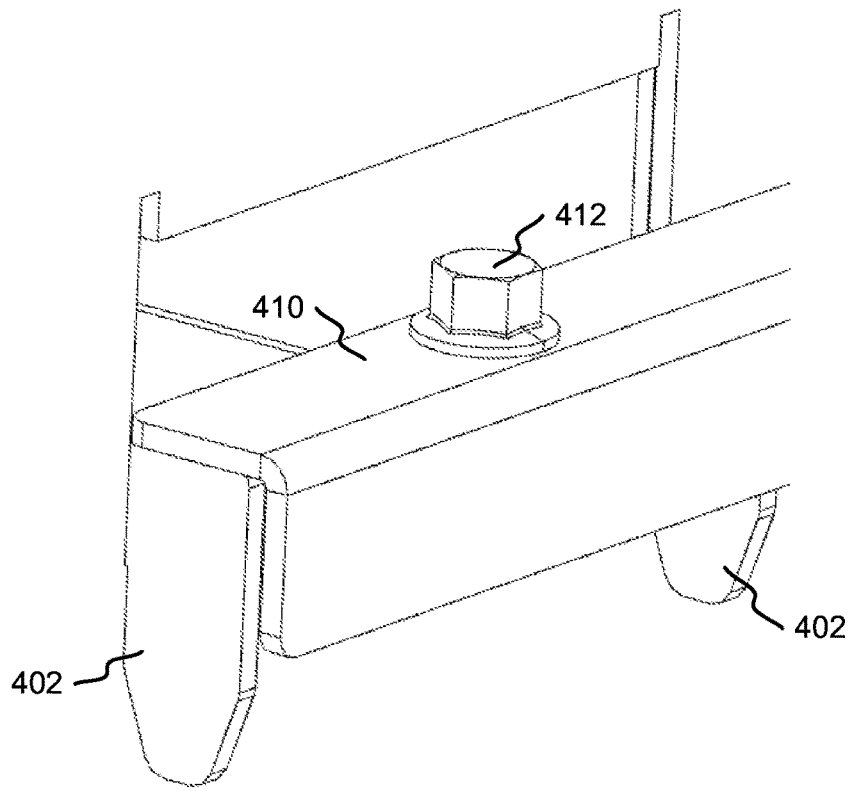
FIG. 4B depicts the end of a vane secured with a securing bar, in accordance with embodiments.
Figure 4C:
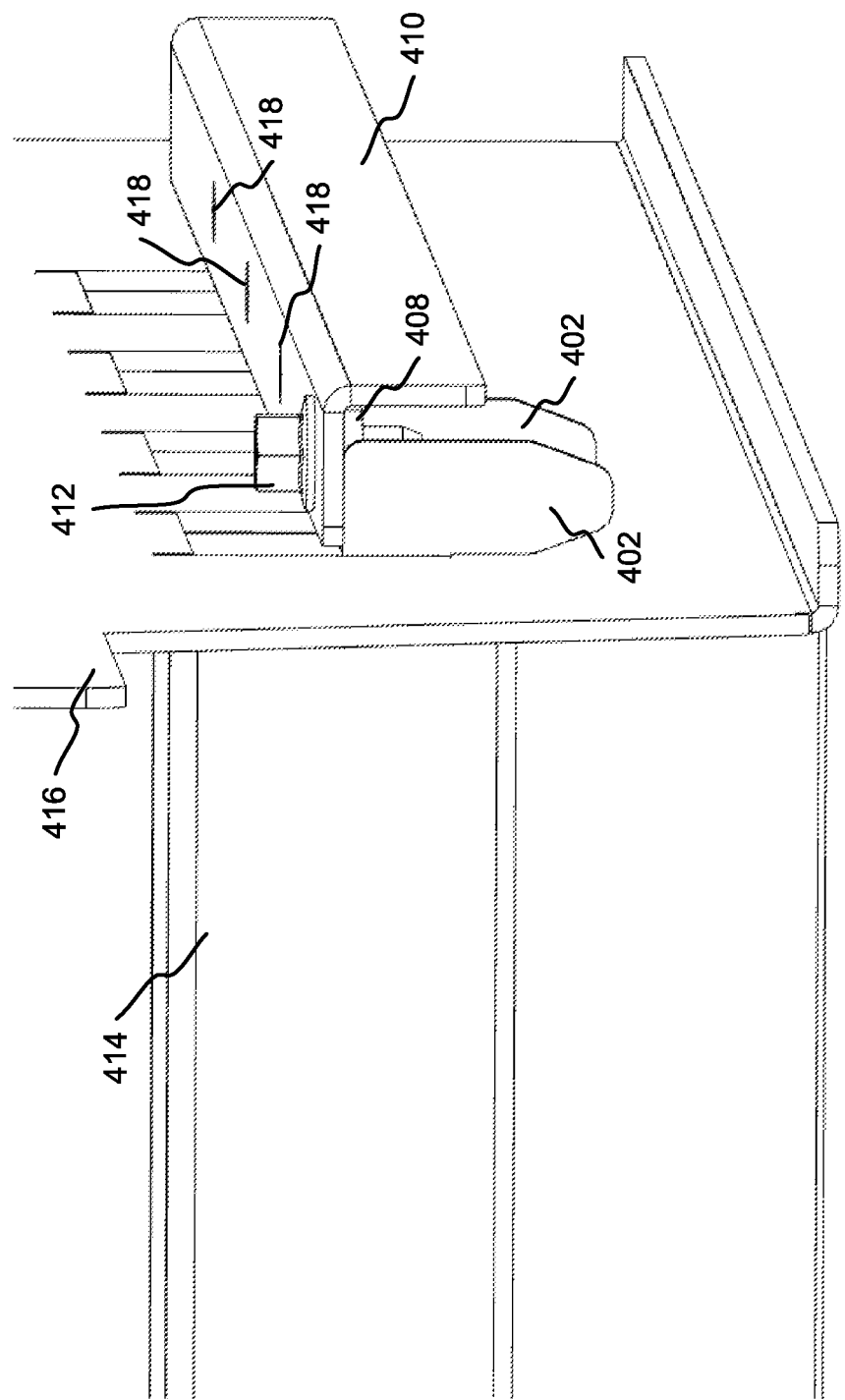
FIG. 4C depicts an alternative view of a vane secured with a securing bar, in accordance with embodiments.

FIGS. 4A-4C illustrate one embodiment of the end of a vane such as Vane 200 of FIG. 2 interfacing with a frame member such as in FIG. 3. In FIG. 4A, Flanges 402 have been inserted into the slots of the frame member. Rear Edges 404 of Flanges 402 may be flush with Rear Surface 408 of Flange 406. In this illustration, no securing mechanism is present to prevent Flanges 402 from separating from Flange 406. In some embodiments a securing member may be added to prevent Flanges 402 and Flange 406 from separating. Such an embodiment is shown in FIG. 4B. Securing Bar 410 lies against Rear Edges 404 and Rear Surface 408 (not shown), preventing Flanges 402 from separating from Flange 406 (not shown). In this illustration Securing Bar 410 is held in place in part by Bolt 412, which may extend through a hole in Flange 406. In some embodiments Bolt 412 may be tightened to an extent that Securing Bar 410 prevents Flanges 402 from vibrating in place. In other embodiments Securing Bar 410 may be held in place by other mechanisms, such as a clamp, adhesive, a welded bond, any of which may be located near Flange 406 or elsewhere (e.g., on a different flange on the same frame member or at either end of the frame member).

FIG. 4C provides an alternative view of Securing Bar 410 fastening Flanges 402 (and thus the connected vane) in place. In FIG. 4C, Flanges 402 are connected to Vane 414, and inserted through a pair of slots in Frame Member 416. FIG. 4C shows that the horizontal portion of Securing Bar 410 interfaces with the Rear Surface 408 (not shown) of Flange 406 and Rear Edges 404 (not shown) of Flanges 402. In this embodiment, only one Vane 414 has been inserted into an opening on Frame Member 416. However, three other openings are present, each of which may have flanges corresponding to Holes 418 in Securing Bar 410. In this embodiment, additional vanes with L-shaped flanges may be added and held in place by Securing Bar 410. Further bolts may be inserted through Holes 418 to increase the ability of Securing Bar 410 to hold the vanes in place. In other embodiments Frame Member 416 may contain only the opening corresponding to Vane 414, in which case Securing Bar 410 may be significantly shorter, and Holes 418 may not be present. Alternatively, Securing Bar 410 as shown (with Holes 418) may be utilized in embodiments with a small number of vanes (e.g., one or two vanes). In other words, Securing Bar 410 may be utilized in various embodiments in which the number of openings in the frame member (and the corresponding number of vanes to secure) may differ from the length of Securing Bar 410 and the number of holes in Securing Bar 410.

Figure 5:
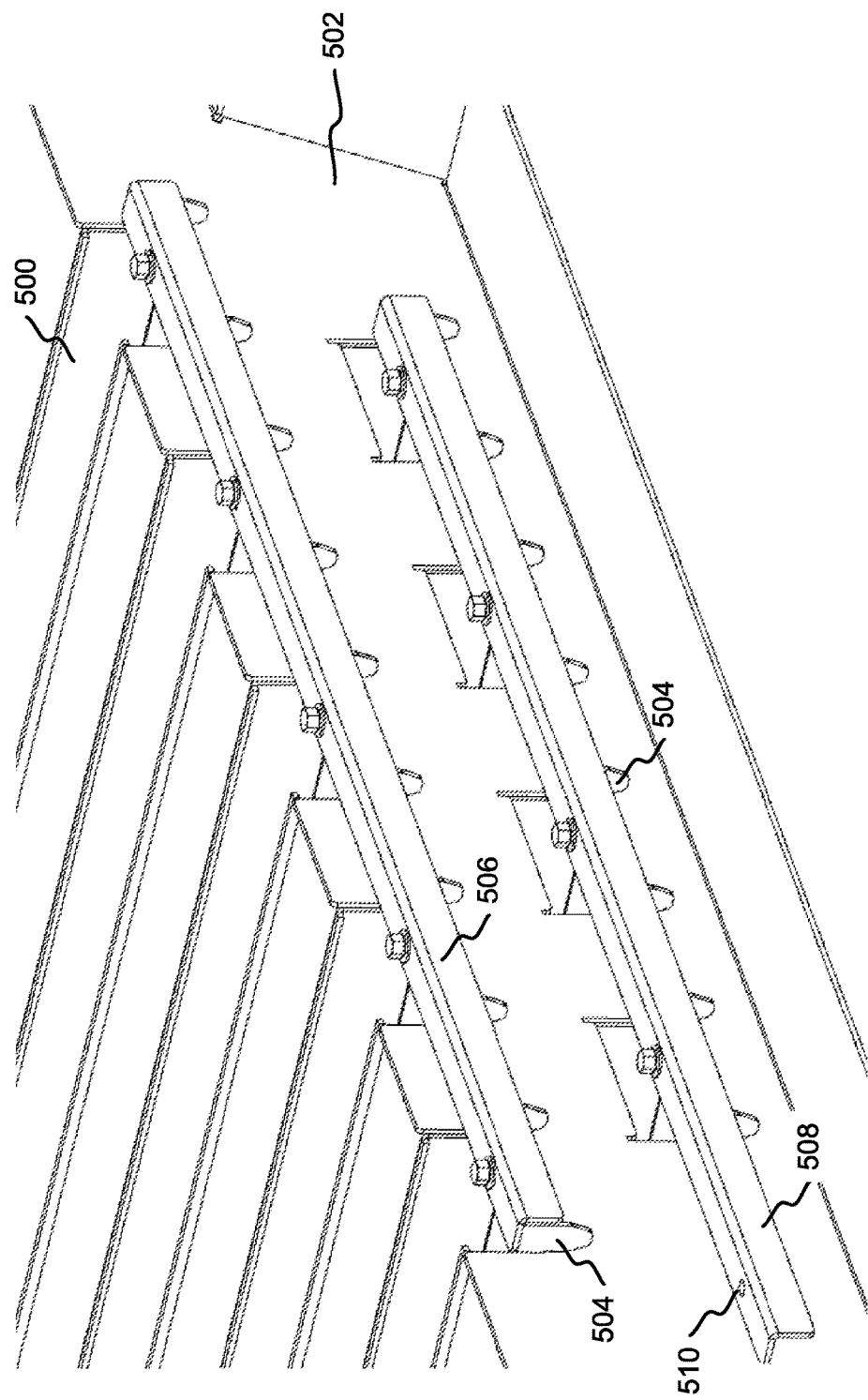
FIG. 5 depicts the ends of multiple vanes interfacing with a frame member, in accordance with embodiments.

FIG. 5 illustrates the modularity with which the solutions described in the present disclosure may be used. In FIG. 5, two rows of Vanes 500 have been attached to Frame Member 502. In this embodiment, the bottom row has four vanes, whereas the top row has five vanes. Each of the vanes contain a set of L-shaped Flanges 504. The top-row vanes are held in place by Securing Bar 506, and the bottom-row vanes are held in place by Securing Bar 508. In this embodiment Securing Bar 506 and Securing Bar 508 are interchangeable parts, and thus Securing Bar 508 contains unused Hole 510. In some embodiments either the top row or bottom row may contain more than five vanes, in which case one or both of Securing Bar 506 and Securing Bar 508 may be longer, or all securing bars may have five holes, but multiple securing bars may be used on rows with more than five vanes. In other embodiments Frame Member 502 may have more than two rows of vanes, in which case more securing bars may be used.

In the embodiment illustrated by FIG. 5, many parts may be interchangeable to other parts used for the same purpose. This may reduce the cost of designing and setting up the manufacturing processes for the components of multiple different server-rack door designs (e.g., a door with four rows with four vanes and a door with one row of three vanes may each use securing bars with six holes). In some instances this may also enable components to be obtained at high-volume prices. In this embodiment, for example, all nine Vanes 500, both Securing Bar 506 and Securing Bar 508, and all bolts may be substantially identical to similarly used components (e.g., each Vane 500 is substantially identical to each other Vane 500) such that they are interchangeable. Because these substantially identical parts may, in some embodiments, be used in other server-door designs as well, only one manufacturing solution may be necessary for multiple implementations, even when those implementations differ. This increases the ability to and benefit of ordering components at high volume.

In this embodiment the openings in Frame Member 502 that correspond to the top-row vanes differ in design from the openings corresponding to the bottom-row vanes. Namely, the top-row openings are not bound on all four sides. This may reduce the time and effort required to insert the L-shaped Flanges 504 for the top-row Vanes 500 into the openings, which may reduce the human-labor cost of the server-door assembly. In some other embodiments, however, there may be cost savings in the top and bottom row openings being interchangeable (e.g., the cost to machine a single opening design may be significantly less than the cost to machine two opening designs), in which case the openings may be substantially identical.

Figure 6A:
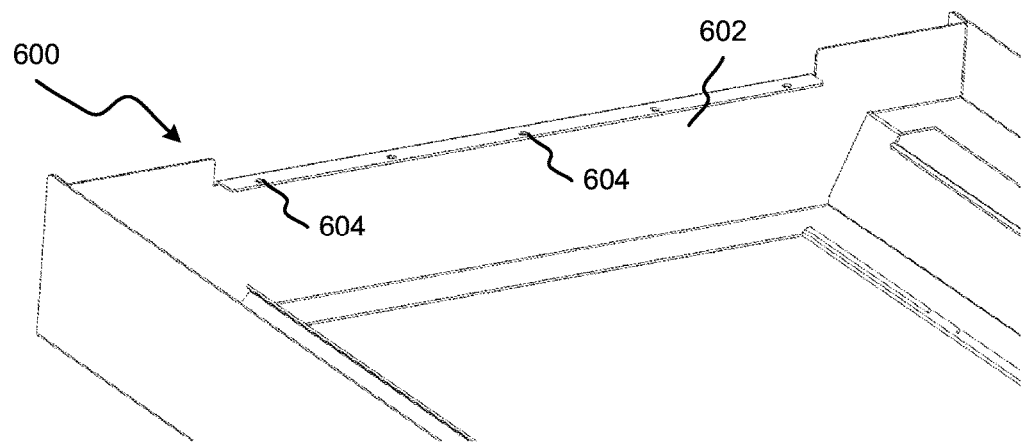
FIG. 6A depicts a view of a first frame sub member installed in a server door frame, in accordance with embodiments.
Figure 6B:
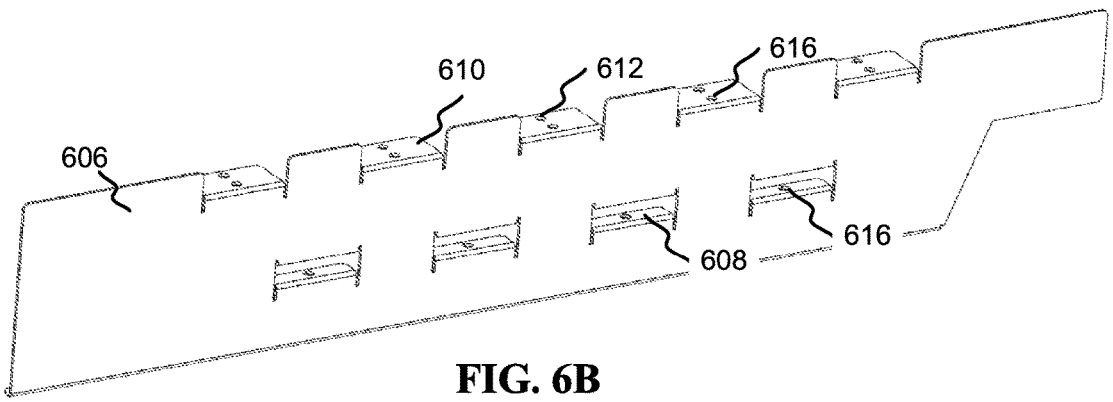
FIG. 6B depicts a view of a second frame sub member that may attached to the first frame sub member, in accordance with embodiments.
Figure 6C:
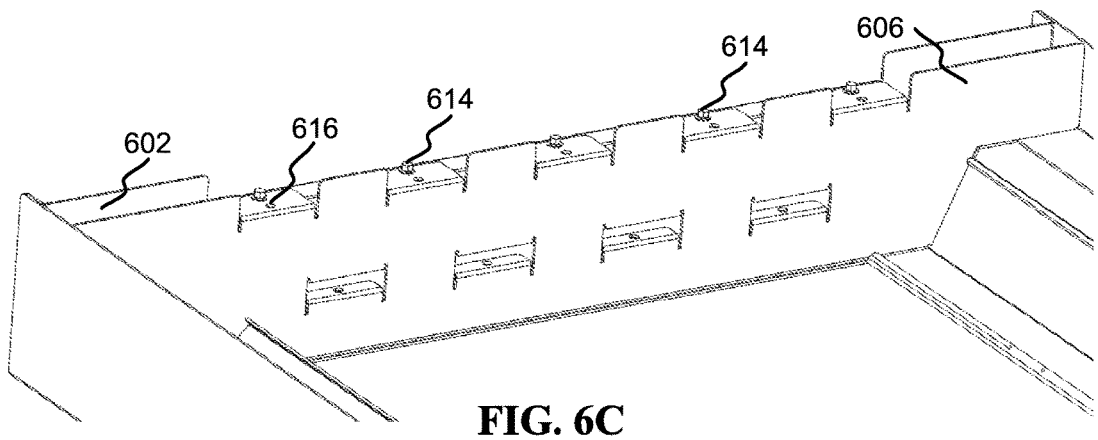
FIG. 6C depicts a view of the second frame sub member attached to the first frame sub member, in accordance with embodiments.

FIGS. 6A-6C illustrate an embodiment in which a frame member is composed of multiple sub members that may be separated to increase the ease with which vanes may be attached to the frame member. This may also reduce the human-labor cost of the server-door assembly. FIG. 6A shows a section of a Door Frame 600 with a frame Sub Member 602. Sub Member 602 has a series of Holes 604 through which a second frame sub member may be attached to Sub Member 602. FIG. 6B illustrates Sub Member 606 separated from a server-door assembly. Sub Member 606 has two rows of openings into which the end of a vane may be inserted, similar to Frame Member 502 of FIG. 5. Protruding from Sub Member 606 are Flanges 608 at the locations of the bottom-row openings and Flanges 610 at the locations of the top-row openings. Both Flanges 608 and 610 contain Holes 616, through which a securing bar may be attached to the flanges. However, each of Flanges 610 contain an additional Hole 612 which, in this embodiment, corresponds to one of Sub Member 602's Holes 604.

FIG. 6C illustrates Sub Member 606 attached to Sub Member 602. Screws 614 have been inserted through Holes 612 and 604, securing Sub Member 606 to Sub Member 602. In some embodiments this attachment may be performed before vanes have been attached to Sub Member 606. However, in the embodiment illustrated in FIGS. 6A-6C it may be beneficial to attach vanes prior to attaching Sub Member 606 to Sub Member 602; Sub Member 602 may impede access to Flanges 608 once Sub Member 606 is attached. Further, attaching vanes to Flanges 608 and 610 prior to attaching Sub Member 606 may increase the speed at which the vanes may be inserted to corresponding openings on an opposite frame member (e.g., opposite the door frame of Sub Member 606). This may reduce the cost of human labor in assembling the server door.

In this embodiment Sub Members 606 and 602 are connected through Holes 612 and 604. However, in some embodiments each of Flanges 610 may be designed with only Hole 616. In these embodiments Sub Members 606 and 602 may be connected through Hole 616, the same hole through which a securing bar is attached to Flanges 610. In other embodiments Sub Members 606 and 602 may be connected through another means, such as a clamp, adhesive, a welded bond, or others.

FIGS. 7A-7D illustrate a cross-section profile of one embodiment of a vane with a flexible insulating member installed in multiple configurations. Vane 700 may be a vane design that may be installed in a frame member according to any of FIGS. 1-5. Vane 700 has Cavity 702, into which an insulating member may be installed to reflect or absorb sound and electromagnetic radiation or to redirect air flow. Vane 700 has a Tab 704 on each side of Cavity 702. Tab 704 may be used to secure insulating members in Cavity 702, as will be shown in connection with FIGS. 7C and 7D. In some embodiments, Tab 704 may extend the entire length of Vane 700. In other embodiments, one shorter Tab 704 may be located only at one point throughout the length of Vane 700 (e.g., the middle) or multiple shorter Tabs 704 may be located throughout the length of Vane 700 (e.g., at each end and at the middle). In some embodiments Vane 700 may have a tab only on one side of Cavity 702.

Figure 7B:
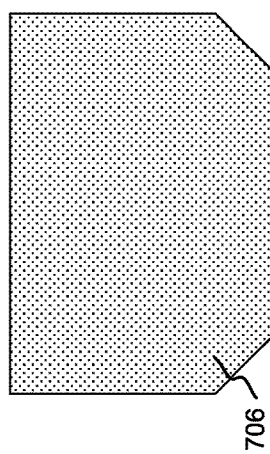
FIG. 7B depicts a cross-sectional view of a flexible insulating member, in accordance with embodiments.

FIG. 7B illustrates one embodiment of a cross section of an Insulating Member 706 that may be inserted into Cavity 702. Insulating Member 706 may be composed of any material with sufficient flexibility to be inserted into Cavity 702 past Tabs 704 and with insulating properties. For example, Insulating Member 706 may be composed of open-cell polyurethane foam or closed-cell polystyrene or neoprene foam. Insulating Member 706 has a pentagon cross section in this embodiment, but in other embodiments it may take other forms (e.g., a square, a kite, or a regular or irregular hexagon).

Figure 7D:
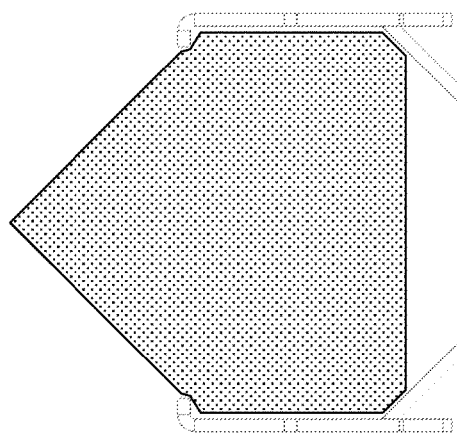
FIG. 7D depicts a cross-sectional view of a flexible insulating member inserted into a vane in an alternate orientation, in accordance with embodiments.
Figure 7A:
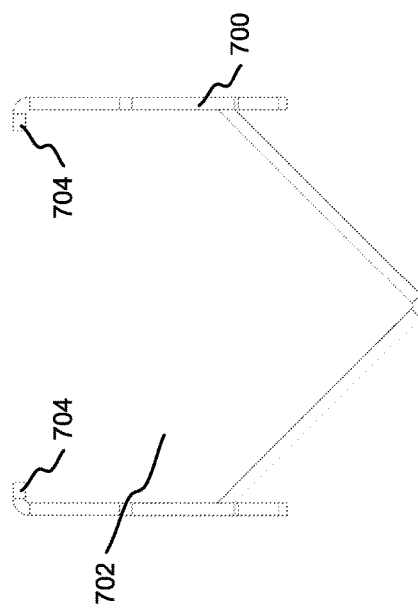
FIG. 7A depicts a cross-sectional view of a vane, in accordance with embodiments.
Figure 7C:
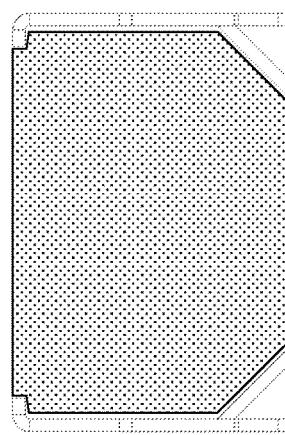
FIG. 7C depicts a cross-sectional view of a flexible insulating member inserted into a vane, in accordance with embodiments.

FIG. 7C illustrates one embodiment in which Insulating Member 706 may inserted into Cavity 702. This orientation of Insulating Member 706 may be beneficial when space limitations preclude Insulating Member 706 from spreading past Tabs 704 or for airflow considerations. Insulating Member 706 has been deformed by Tabs 704, which, in this embodiment, prevent Insulating Member 706 from exiting the cavity. In this embodiment Insulating Member 706 may also be prevented from vibrating or rattling in Cavity 702 by the pressure placed upon it by Tabs 704. In some embodiments Insulating Member 706 may be slightly shorter, such that Tabs 704 only make contact with the top of Insulating Member 706 and do not squeeze the sides of Insulating Member 706. This may make Insulating Member 706 less likely to exit Cavity 702, but may also make Insulating Member 706 more likely to vibrate within Cavity 702.

FIG. 7D illustrates a second embodiment in which Insulating Member 706 may be inserted into FIG. 7D. This orientation may be beneficial to direct airflow to either side of Vane 700 in embodiment in which space limitations are less constricting than in FIG. 7C. In this embodiment Tabs 704 again deforms Insulating Member 706, which may again prevent Insulating Member 706 from exiting Cavity 702.

As FIGS. 7C and 7D show, Insulating Member 706, if flexible, may be installed in multiple orientations in different embodiments. This may enable assemblers of server-rack doors to order a high volume of one flexible-insulating-member design, which may reduce the cost of the part. Further, because the insulating member is flexible, it can be inserted into the cavity of a vane with ease by a human installer without the use of any tools, which may reduce the cost of human labor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A door assembly comprising:
   a rectangular door frame having a first, second, third, and fourth frame member;
   an outer surface of the first frame member having a first pair of parallel slots
   a first planar flange arranged between the first pair of parallel slots and protruding out from and perpendicular to the outer surface;
   a vane extending from the first frame member to the second frame member between the third and fourth frame members, a first end of the vane including a first pair of parallel flanges fitted into the first pair of slots such that a rear surface of the first planar flange is arranged between rear edges of the first parallel flanges; and
   a bar mounted to the rear surface of the first planar flange and configured to hold the rear edges of the first parallel flanges in a substantially same plane as the rear surface of the first planar flange.

2. The door assembly of claim 1, wherein the vane comprises a cavity into which a flexible insulating strip is inserted.

3. The door assembly of claim 2, wherein the vane comprises a tab that secures the flexible insulating strip in place in the cavity.

4. The door assembly of claim 1, wherein the bar is mounted to the first planar flange by a bolt through the bar and first planar flange.

5. The door assembly of claim 1, further comprising:
   a second pair of parallel slots on the outer surface of the first frame member; and
   a second planar flange arranged between the second pair of parallel slots and protruding out from and perpendicular to the outer support surface.

6. The door assembly of claim 5, wherein the second planar flange is positioned relative to the first planar flange such that the bar rests on a rear surface of the second planar flange when the bar is mounted to the rear surface of the first planar flange.

7. The door assembly of claim 5, wherein the second planar flange is offset from the first planar flange in a first dimension, wherein a length along the first dimension corresponds to a thickness of the door assembly.

8. The door assembly of claim 1, wherein the second frame member is positioned opposite the first frame member with respect to the door frame and comprises a first sub member releasably attached to a second sub member, the first sub member comprising:
   a third pair of parallel slots; and
   a third planar flange arranged between the third pair of parallel slots and protruding out from and perpendicular to an outer surface of the first sub member.

9. The door assembly of claim 8, further comprising:
   a second end of the vane comprising a second pair of parallel flanges fitted into the third pair of parallel slots such that a rear surface of the third planar flange is arranged between rear edges of the second parallel flanges; and
   a second bar mounted to the rear surface of the third planar flange and configured to hold the rear edges of the second parallel flanges in a substantially same plane as the rear surface of the third planar flange.

10. A method of assembling a door, comprising:
    attaching a first end of a first vane to a first frame member of the door, the attaching the first end comprising:
      inserting a first pair of parallel flanges on the first end into a first pair of parallel slots on an outer surface of the first frame member, such that a rear surface of a first planar flange is arranged between rear edges of the first parallel flanges; and
      mounting a first bar to the rear surface of the first planar flange such that the bar holds the rear edges of the first parallel flanges in a substantially same plane as the rear surface of the first planar flange; and
    attaching a second end of the first vane to a second frame member of the door, wherein the second frame member is opposite the first frame member with respect to the door, and the attaching the second end comprises:
      inserting a second pair of parallel flanges on the second end into a second pair of parallel slots on an outer surface of a first sub member of the second frame member, such that a rear surface of a second planar flange is arranged between rear edges of the second parallel flanges;

mounting a second bar to the rear surface of the second planar flange such that the second bar holds the rear edges of the second parallel flanges in a substantially same plane as the rear surface of the second planar flange; and mounting the first sub member to a second sub member of the second frame member, wherein the second sub member is fixedly attached to the door assembly.

11. The method of claim 10, further comprising inserting a first flexible insulating strip into a cavity of the first vane, wherein the cavity comprises a tab that secures the first flexible insulating strip in place.

12. The method of claim 10, wherein the first bar is mounted to the rear surface of the first planar flange with a first bolt.

13. The method of claim 10, wherein the second bar is mounted to the rear surface of the second planar flange with a second bolt.

14. The method of claim 10, wherein the first sub member is mounted to the second sub member with a third bolt.

15. The method of claim 10, wherein the first bar is mounted to the rear surface of the first planar flange with a first bolt, the second bar is mounted to the rear surface of the second planar flange with a second bolt, the first sub member is mounted to the second sub member with a third bolt, and the first, second, and third bolts are substantially identical, such that they are interchangeable.

16. The method of claim 10, wherein the first bar and the second bar are substantially identical such that they are interchangeable.

17. The method of claim 10, further comprising:

attaching a first end of a second vane to the first frame member; and attaching a second end of the second vane to the second frame member;

wherein the first vane and the second vane are substantially identical such that they are interchangeable.

18. The method of claim 17, further comprising inserting a second flexible insulating strip into a cavity of the second vane, wherein the first flexible insulating strip and the second flexible insulating strip are substantially identical such that they are interchangeable.

\* \* \* \* \*